AMPLIFIER FOR RADIO RELAY WITH CASCADE ARRANGEMENT OF DIRECTIONAL GUIDES AND PARAMETRIC AMPLIFIERS USING COMMON PUMP SOURCE

Filed March 20, 1964

United States Patent Office 3,334,299

Patented Aug. 1, 1967

3,334,299

AMPLIFIER FOR RADIO RELAY WITH CASCADE ARRANGEMENT OF DIRECTIONAL GUIDES AND PARAMETRIC AMPLIFIERS USING COMMON PUMP SOURCE

Herbert Holzwarth, Stockdorf, Germany, assignor to Siemens & Halske Aktiengesellschaft, Berlin and Munich, Germany, a corporation of Germany Filed Mar. 20, 1964, Ser. No. 353,422
Claims priority, application Germany, Mar. 27, 1963, S 84,401
9 Claims. (Cl. 325—9)

The invention relates to an arrangement for the amplification of very short electromagnetic waves, especially a linear amplifier for a relay station in a directional radio system.

An amplifier of this type comprises several parametric amplifier stages which are circuited in cascade, with use of a microwave circulator, in such a way that with the exception of the one or two connections which precede the signal frequency input in the direction of rotation of the circulator, each of the terminal connections involving the input signal frequency in the rotational direction of the circulator is connected with a parametric amplifier stage, and in which, as a signal frequency output, is provided one of the connections which is situated between the connections for the parametric amplifier stages and the signal input connection.

The object of the invention is the formation of an arrangement for the amplification of very short electromagnetic waves in such a way that it makes it possible, in an advantageously simple manner, to achieve high amplification values as it is relatively difficult, in practice, to utilize circulators which have more than four connections. A circulator with four connections, however, allows at best, the connection of only two parametric amplifier stages, and with only two parametric amplifier stages, there are achieved in the case of very weak input signals, only amplification values which lead to outputs that are insufficient for the control of a transmitter stage for the directional transmission.

This problem is solved according to the invention in such a way that onto the signal output of the circulator, preferably with interposition of a directional guide, additional parametric amplifier stages are connected, likewise circuited in cascade, with the number of parametric amplifier stages being made high enough that the output performance of the last amplifier stages amounts at least from 1 to 10 mw.

There can advantageously be achieved an amplification gain in the individual parametric amplifier stages of between 10 and 15 decibels.

Expediently with an output of about 1 to 10 mw. at the output of the last parametric amplifier stage, the amplifier system of a directional radio installation or similar installation may be utilized, thereby enabling the use of a power amplifier having a traveling field tube whose amplification lies between about 30 and 40 decibels.

For the same purpose it is also possible to proceed in such a way that, especially with the use of capacitance diodes as nonlinear reactance in the individual parametric amplifier stages, the number of parametric amplifier stages may be such that the output performance, amounting to at least 1 watt, is sufficiently high that it can be utilized for direct transmission.

If the amplifier system is used in the relay station of a radio system, especially a directional radio system, in which the frequency of the output signal is to be different from that of the input signal, the necessary frequency converters can be provided in the amplifier chain or at the output of the same.

The individual parametric amplifier stages can be arranged with their pump-frequency inputs connected to a common pump-frequency oscillator.

An especially advantageous arrangement for the amplification of very short electromagnetic waves, in a further development of the invention, is characterized by the feature that the amplifier stages, cascaded over directional guides, in each case contain a hollow-space resonator, in which the individual frequencies necessary for the parametric operation can be separately excited and which contains the nonlinear reactance for the parametric amplification. In such arrangement, the individual hollow-space resonators succeeding one another in transmission direction and to be connected over a directional guide, have a wall part in common, which, in a manner known in filtering techniques, is formed as coupling point, dependent on the transmission direction, for example, by insertion of a coupling aperture filled at least partially with gyromagnetic material.

The invention is explained in detail in connection with the drawing wherein.

Figures 1, 2, 3, 4:
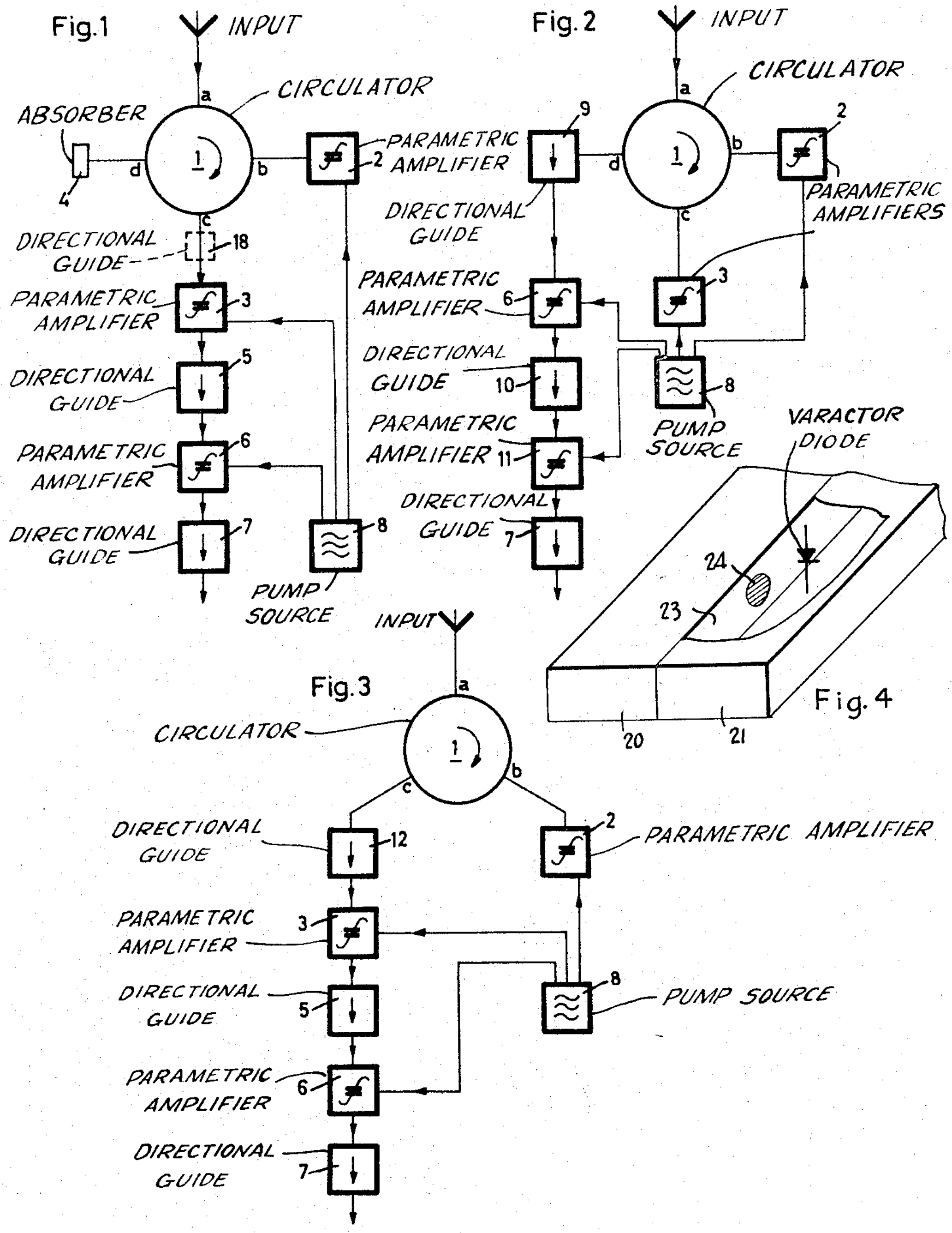
FIG. 1 is a diagrammatic representation of an amplifier embodying the invention.
FIG. 2 is a similar representation of a modified form of the amplifier illustrated in FIG. 1.
FIG. 3 is a similar representation illustrating the use of three armed circulator.
FIG. 4 is a view in perspective of a pair of resonators of individual amplifiers illustrated in FIGURES 1–3.

FIG. 1 illustrates a four-armed circulator 1, to the first connection *a* of which, in rotational direction, there is connected the source of the input signal, for example, an antenna. To connection *b*, the next in the rotational direction of the circulator, is connected a first parametric amplifier stage 2, and to the next connection in rotational direction of the circulator is connected a second parametric amplifier stage 3. The unconnected circulator connection *d*, is closed, at least very nearly reflection-free, by means of an absorber 4, which has the function of uncoupling connection *c* from connection *a* in the rotational direction of the circulator 1.

The parametric amplifier stage 3 may also be connected over a directional guide 18, the directional guide 18 being indicated in FIG. 1 only in broken lines. To the parametric amplifier stage 3, over a directional guide 5 there is connected a third parametric amplifier stage 6. The directional guide has practically no transmission attenuation in the transmission direction from the amplifier stage 3 to the amplifier stage 6, but in the opposite transmission direction has a very high transmission attenuation, for example between 30 and 50 decibels. To the parametric amplifier stage 6, depending on the required amplification, further parametric amplifier stages can be connected, which are not represented in detail in the drawing and may be advantageously circuited in cascade over additional directional guides—as indicated by the directional guide 7.

All the parametric amplifier stages are fed from a common source 8, for the pump frequency, for example an oscillator with a disk triode or a reflex klystron. Each of the parametric amplifier stages 2, 3 and 6 is designed in a known manner and contains coupling devices for the signal frequency, the pump oscillation and the so-called idling load. It is preferable, in a known manner, to selectively construct the individual amplifier stages for each of the corresponding frequencies.

The manner of operation of the amplifier device illustrated in FIG. 1 can be generally considered as follows:

The pump oscillator 8 feeds all the parametric amplifier stages with the necessary pump oscillation. An input signal fed in over connection *a* into the circulator passes over connection $b$ to the first parametric amplifier stage 2, is there raised in amplitude, reflected and, thereby amplified, is fed into the connection $b$. This signal, amplified by the parametric amplifier stage, reflected and fed into the connection $b$, passes over the connection $c$ of the circulator, if desired over directional guide 18, into the second parametric amplifier stage 3 and is there again amplified. To the signal frequency circuit of the parametric amplifier stage 3 the previously mentioned directional guide 5 is connected, which feeds a part of the amplified signal frequency energy, preferably a considerable proportion, into the third parametric amplifier stage 6. If an assumption is made, that the gain for each parametric amplifier stage, measured between input and output, amounts to 10 to 15 decibels, there can be achieved with the whole amplifier system an amplification of about 30 to 45 decibels. If there are further added, in cascade manner, one or two additional parametric amplifiers then can be attained an amplification of 50 to 75 decibels, considered necessary as a rule, in directional radio extensions in relay stations in order to raise the input signal to a level which is required for driving a power tube in the last transmitter stage of a relay station. This level lies at about 1 to 10 milliwatts. Under some circumstances the performance of the last parametric amplifier stage is sufficient for direct transmission purposes. In this case, the output performance of the last parametric amplifier stage will be selected as high as necessary and technically possible, in particular, on the order of magnitude of 1 watt.

In FIG. 2 a further development is illustrated of the parametric amplifier shown in FIG. 1, wherein the connection $d$ is connected over a directional guide 9 with the third parametric amplifier stage 6 in a transmission direction. This directional guide must, however, have a transmission attenuation in the reverse direction from the parametric amplifier stage 6 to the circulator connection $d$, which is at least 10 decibels greater than the amplification of the parametric amplifier stage 6 and must have characteristics as good as that of absorber 4 of FIG. 1. To the parametric amplifier stage 6, over a further directional guide 10, on which lesser requirements can be imposed, a fourth parametric amplifier stage 11 is connected. With regard to the feed and the design of the individual parametric amplifiers the same holds as in the case of the embodiment according to FIG. 1.

If a three-armed circulator is used, the procedure illustrated in FIG. 3 may be followed. In this case there is connected between connection $c$ of the circulator, and the second parametric amplifier stage 3, a directional guide 12, whose transmission attenuation in the reverse direction from the second parametric amplifier stage 3 to the connection $c$ is at least 10 to 15 decibels higher than the amplification of the parametric amplifier stage 3. The third parametric amplifier stage 6 is connected, in the transmission direction, as in the embodiment according to FIG. 1, over a directional guide 5. To the parametric amplifier stage 6 additional parametric amplifier stages can be connected in cascade circuit.

The preferred construction of the parametric amplifier stages coupled over directional guides is illustrated in FIGURE 4. A pair of hollow chamber resonators 20 and 21 of the individual amplifier stages, for example, amplifiers 3 and 6 in FIGURE 1, are placed adjacent to one another and have in a common wall part 23$a$ coupling aperture 24 aperture in which, preferably by means of an external premagnetization device, for example, a permanent magnet system, premagnetized gyromagnetic material is so arranged, that these coupling apertures, together with the gyromagnetic material, form in each case a directional guide. Such directional guides are in themselves known, for example, through German Patent 1,000,480, and U.S. Patents 2,849,686 and 2,849,687, so that a detailed discussion of these is believed unnecessary. The first hollow chamber resonator, in the transmission direction, is, for example, provided with a coupling loop for the coupling of the input signal, which may also be directionally selective, for example by means of gyromagnetic material, as previously mentioned, and in the last hollow chamber resonator, in transmission direction, a corresponding coupling-on device is to be provided for deriving the amplified signal energy. Further, all of the hollow chamber resonators are to be formed, by means of tuning members, designed in a known manner, tunable in the required manner, and are further provided with coupling devices for the coupling of the pump energy. For coupling the pump energy, it is preferable that the individual coupling devices be uncoupled with respect to one another, as, for example, by interposed attenuating members or directional guides. The uncoupling must in each case be appreciably greater than the possible overcoupling of signal energy between these pump oscillation coupling members, so that an auto-excitation over this path will with certainty be avoided.

Changes may be made within the scope and spirit of the appended claims which define what is believed to be new and desired to have protected by Letters Patent.

I claim:

1. An amplifier system for very short electromagnetic waves in a relay station of a directional radio system comprising a circulator having first, second and third ports; signal reception means connected to said first port of said circulator; a first parametric amplifier for the amplification of the electromagnetic waves connected to said second port of said circulator; a plurality of second parametric amplifiers; a plurality of directional guides; each of said second parametric amplifiers and each of said directional guides being connected in a series circuit to one another with alternate successive ones of said parametric amplifiers connected between respective alternate successive ones of said directional guides, an input of said series circuit connected to said third port of said circulator; means for the emission of the amplified electromagnetic waves connected to the output of said series circuit; and a pump energy source connected in common to said first and said plurality of second parametric amplifiers.

2. An amplifier system as defined in claim 1 wherein said circulator includes a fourth port, and further comprising a third parametric amplifier connected to said fourth port of said circulator and to said pump energy source.

3. An amplifier system as defined in claim 1 wherein said circulator includes a fourth port, and further comprising an absorber connected to said fourth port of said circulator.

4. An amplifier system for very short electromagnetic waves in a relay station of a directional radio system comprising a circulator having first, second and third ports; signal reception means connected to said first port of said circulator; a first parametric amplifier for the amplification of the electromagnetic waves connected to said second port of said circulator; a first directional guide connected to said third port of said circulator; a plurality of second parametric amplifiers connected in cascade circuit and having an input connected to an output of said first directional guide; and a plurality of second directional guides connected between the individual ones of said second amplifiers with one of said second directional guides being connected at an output of the cascade circuit; means for the emission of the amplified electromagnetic waves connected to the output of said cascade circuit; and a pump energy source connected in common to said first and said plurality of second parametric amplifiers.

5. An amplifier system as defined in claim 4 further comprising a power amplifier stage connected between said one of said second directional guides and said emission means.

6. An amplifier system for very short electromagnetic waves in a relay station of a directional radio system comprising a circulator having first, second, third and fourth ports; signal reception means connected to said first port of said circulator; a first parametric amplifier for the amplification of the electromagnetic waves connected to said second port of said circulator; a second parametric amplifier for the amplification of the electromagnetic wave energy connected to said third port of said circulator; a first directional guide connected to said fourth port of said circulator; a plurality of third parametric amplifiers connected in a cascade circuit having an input thereof connected to the output of said first direction guide; a plurality of second directional guides connected between individual ones of said plurality of second amplifiers and one of said second directional guides being connected at the end of said cascade circuit; means for transmitting the amplified electromagnetic waves connected to the output of said cascade circuit; and a pump energy source connected in common to all of said parametric amplifiers.

7. An amplifier system as defined in claim 6 further comprising a power amplifier stage connected between said one of said second directional guides and said transmitting means.

8. An amplifier system for very short electromagnetic waves in a relay station of a directional radio system comprising a circulator having first, second, third and fourth ports; signal reception means connected to said first port of said circulator; a first parametric amplifier for the amplification of the electromagnetic waves connected to said second port of said circulator; a first directional guide connected to said third port of said circulator; a plurality of second parametric amplifiers connected in a cascade circuit having an input connected to the output of said first directional guide; a plurality of second directional guides connected between the individual ones of said second parametric amplifiers and one of said second directional guides being connected at the end of said cascade circuit; means for the transmission of the amplified electromagnetic waves connected to the output of said cascade circuit; a pump energy source connected in common to all of said parametric amplifiers; and an absorber connected to said fourth port of said circulator.

9. An amplifier system as defined in claim 8 including a power amplifier stage connected to said one of said second directional guides in said transmitting means.

References Cited

UNITED STATES PATENTS

| | | | |
|---|---|---|---|
| 3,045,235 | 7/1962 | Alsberg et al. | 325—23 X |
| 3,114,881 | 12/1963 | Uenohara | 325—491 |
| 3,144,615 | 8/1964 | Englebrecht | 330—4.6 |
| 3,212,018 | 10/1965 | Amoss et al. | 325—24 X |
| 3,230,465 | 1/1966 | Steinke | 330—4.9 |
| 3,293,447 | 12/1966 | Fleming | 307—88.3 |

JOHN W. CALDWELL, *Acting Primary Examiner.*

B. V. SAFOUREK, *Assistant Examiner.*